(12) United States Patent
Kurosawa et al.

(10) Patent No.: US 7,459,847 B2
(45) Date of Patent: Dec. 2, 2008

(54) WIRING STRUCTURE, SUBSTRATE FOR A DISPLAY DEVICE PROVIDED THEREWITH, AND DISPLAY DEVICE

(75) Inventors: Yoshio Kurosawa, Kawasaki (JP); Takuya Watanabe, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 338 days.

(21) Appl. No.: 10/925,840

(22) Filed: Aug. 25, 2004

(65) Prior Publication Data
US 2005/0212412 A1 Sep. 29, 2005

(30) Foreign Application Priority Data
Mar. 29, 2004 (JP) ............... 2004-094215

(51) Int. Cl.
*H01J 63/04* (2006.01)
(52) U.S. Cl. ...................... 313/504; 313/512
(58) Field of Classification Search ................ 313/504, 313/506, 512; 257/E33.061 A, 88
See application file for complete search history.

(56) References Cited

U.S. PATENT DOCUMENTS

| | | | | |
|---|---|---|---|---|
| 5,780,174 A * | 7/1998 | Tokito et al. | ................. | 428/690 |
| 5,804,918 A * | 9/1998 | Yazawa et al. | ............... | 313/506 |
| 5,841,230 A * | 11/1998 | Ikoma et al. | ................. | 313/506 |
| 5,910,706 A * | 6/1999 | Stevens et al. | ............... | 313/498 |
| 6,498,369 B1 * | 12/2002 | Yamazaki et al. | ............ | 257/347 |
| 6,559,594 B2 * | 5/2003 | Fukunaga et al. | ........... | 313/506 |
| 6,587,086 B1 * | 7/2003 | Koyama | ...................... | 345/77 |
| 6,608,449 B2 * | 8/2003 | Fukunaga | ................. | 315/169.3 |
| 6,737,800 B1 * | 5/2004 | Winters et al. | ............... | 313/504 |
| 2001/0052890 A1 * | 12/2001 | Miyazawa et al. | ............ | 345/89 |
| 2002/0074551 A1 * | 6/2002 | Kimura | ...................... | 257/72 |
| 2002/0117962 A1 * | 8/2002 | Beierlein et al. | ............ | 313/504 |
| 2002/0130991 A1 * | 9/2002 | Kamijo | ...................... | 349/106 |
| 2003/0025656 A1 * | 2/2003 | Kimura | ...................... | 345/82 |
| 2003/0057828 A1 * | 3/2003 | Roitman et al. | ............. | 313/506 |
| 2003/0067266 A1 * | 4/2003 | Kim et al. | ................... | 313/504 |
| 2003/0117071 A1 * | 6/2003 | Lee et al. | .................... | 313/512 |
| 2003/0156239 A1 * | 8/2003 | Inoue et al. | ................. | 349/113 |
| 2003/0197466 A1 * | 10/2003 | Yamazaki et al. | ........... | 313/504 |
| 2003/0230972 A1 * | 12/2003 | Cok | ........................... | 313/504 |
| 2004/0012870 A1 * | 1/2004 | Nishikawa et al. | .......... | 359/883 |
| 2004/0152392 A1 * | 8/2004 | Nakamura | ................... | 445/25 |
| 2005/0035710 A1 * | 2/2005 | Tanase et al. | ............... | 313/506 |

FOREIGN PATENT DOCUMENTS

JP 56-116072 9/1981

* cited by examiner

*Primary Examiner*—Joseph L. Williams
*Assistant Examiner*—Hana A Sanei
(74) *Attorney, Agent, or Firm*—Greer, Burns & Crain, Ltd.

(57) ABSTRACT

A wiring structure, a substrate for a display device provided therewith and a display device. The display device features a high brightness and a good display quality. The display device comprises a plurality of pixel regions arranged on a glass substrate; a TFT arranged for each of the pixel regions; an organic EL element including an anode formed by using an ITO for each of the pixel regions, and electrically connected to the source electrode of the TFT, an organic EL layer formed on the anode, and a cathode formed on the organic EL layer to transmit light from the organic EL layer; and a reflection plate for reflecting light from the organic EL layer.

6 Claims, 6 Drawing Sheets

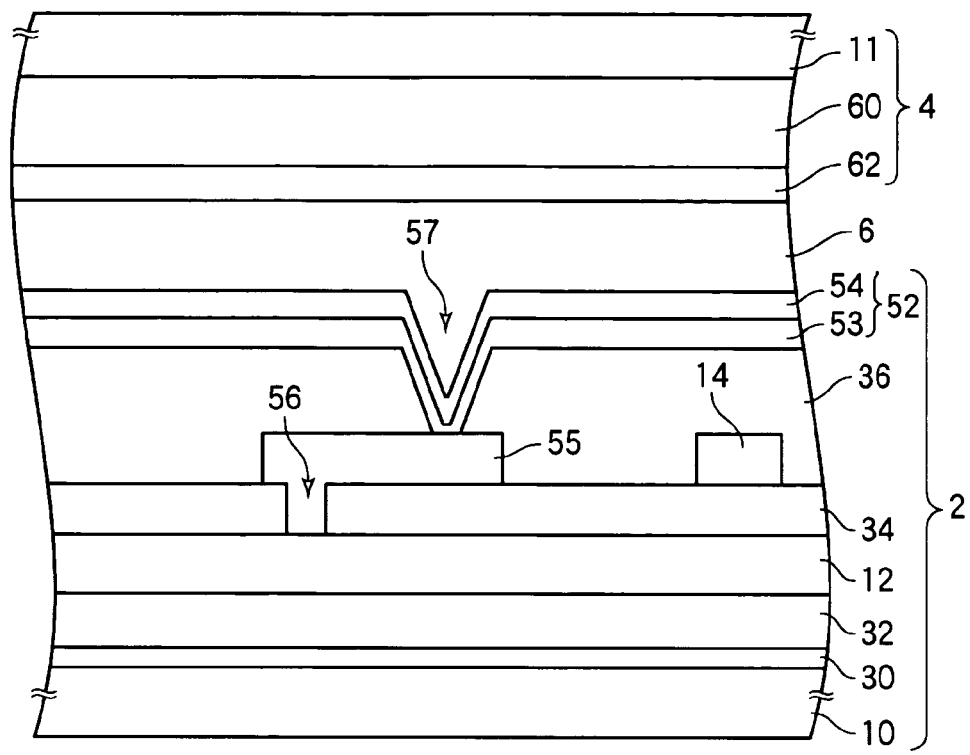
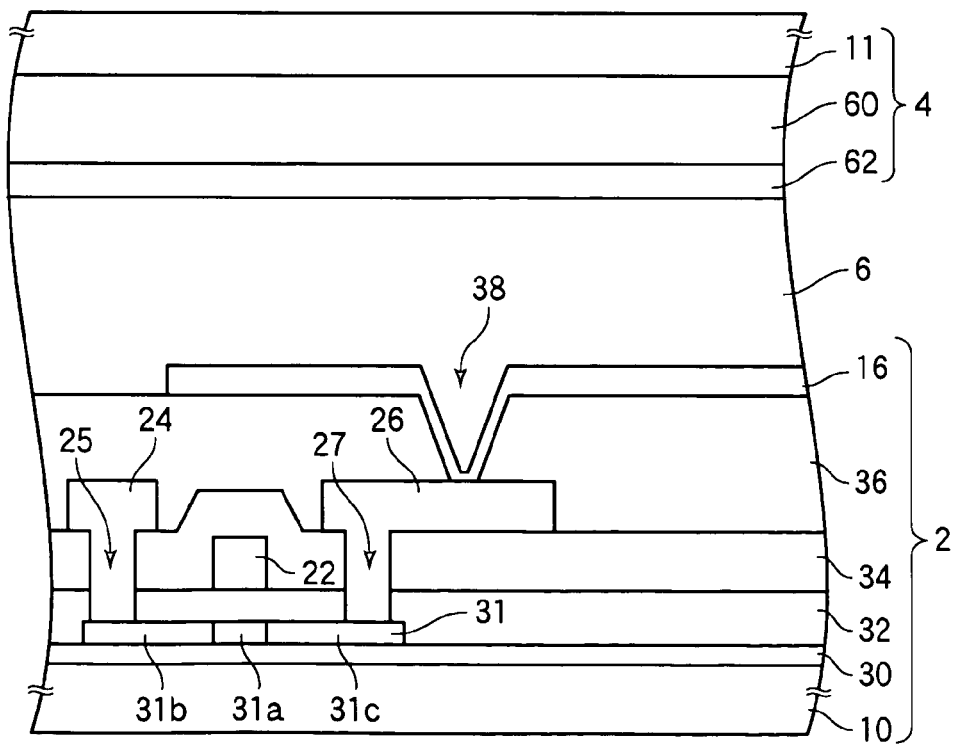

WIRING STRUCTURE, SUBSTRATE FOR A DISPLAY DEVICE PROVIDED THEREWITH, AND DISPLAY DEVICE

BACKGROUND OF THE INVENTION

1. Field of the Invention

The present invention relates to a display device such as an organic electroluminescence display device or a liquid crystal display device, and to a wiring structure used therefore and a substrate for the display device.

2. Description of the Related Art

An organic electroluminescence (EL) display device has anodes formed in the pixel region and connected to the source electrodes of thin film transistors (TFTs) for driving pixels, organic EL layers (light-emitting layers) formed on the pixel electrodes and cathodes formed on the organic EL layers. A bottom emission structure which takes out light from the light-emitting layers onto the side of the substrate (anode side) was a main stream in the conventional organic EL display devices. The organic EL display device is driven by an electric current. In the organic EL display device of the active matrix type, therefore, each pixel requires 2 to 4 TFTs for driving the pixel. No light passes through the regions where the TFTs are formed. Therefore, the aperture ratio decreases in the pixels having an increased number of TFTs per a pixel. Relying upon the bottom emission structure, therefore, it is difficult to realize the organic EL display device having a high brightness.

In recent years, therefore, there has been developed an organic EL display device of the top emission structure which takes out light from the light-emitting layer onto the side opposite to the substrate (onto the cathode side)(JP-A-56-116072). FIG. 6 is a view illustrating in cross section the constitution of a pixel of an active matrix organic EL display device of a general top emission structure. Referring to FIG. 6, an underlying insulating layer 130 is formed on the whole surface on a glass substrate 110. A semiconductor layer 131 of a predetermined shape comprising polysilicon (p-Si) is formed on the underlying insulating layer 130. An insulating film 132 is formed on the whole surface of the substrate and on the semiconductor 131. A gate electrode 122 is formed on the insulating film 132. Of the semiconductor layer 131, a region just under the gate electrode 122 is serving as a channel region 131a. Of the semiconductor layer 131, the regions on both sides of the channel region 131a are serving as a drain region 131b and a source region 131c. An interlayer insulating film 134 is formed on the whole surface of the substrate and on the gate electrode 122. A drain electrode 124 and a source electrode 126 are formed on the interlayer insulating film 134. The drain electrode 124 is connected to the drain region 131b through a contact hole formed in the interlayer insulating film 134 and in the insulating film 132. Similarly, the source electrode 126 is connected to the source region 131c through a contact hole formed in the interlayer insulating film 134 and in the insulating film 132. An interlayer insulating film 136 is formed on the whole surface of the substrate on the drain electrode 124 and on the source electrode 126.

An anode 140 of molybdenum (Mo) is formed on the interlayer insulating film 136 in each pixel region. The anode 140 is connected to the source electrode 126 through a contact hole formed in the interlayer insulating film 136. An organic EL layer 142 is formed on the whole surface of the substrate and on the anode 140. A cathode 144 of aluminum (Al) having a very small thickness is formed on the whole surface of the organic EL layer 142 so as to permit the transmission of light. A transparent electrode 146 is formed on the whole surface of the cathode 144. Unlike the anode 140 formed for each pixel electrode, the cathode 144 and the transparent electrode 146 are formed on the whole surface so as to apply a common potential to all pixels. Therefore, the cathode 144 and the transparent electrode 146 are also called common electrodes.

Light emitted from the organic EL layer 142 include light (arrow a in FIG. 6) that directly passes through the cathode 144 and the transparent electrode 146 so as to be emitted onto the side opposite to the substrate, and light (arrow b in FIG. 6) reflected by the anode 140 and is emitted to the side opposite to the substrate. In the top emission structure, the anode 140 is formed even on a plurality of TFTs (only one of them is illustrated in FIG. 6) arranged in each pixel. Therefore, the aperture ratio is improved as compared to that of the bottom emission structure.

The anode of the organic EL display device is made of a material such as indium tin oxide (ITO), Mo or chromium (Cr) capable of efficiently injecting positive holes. On the other hand, the cathode is made of a material capable of efficiently injecting electrons. In the organic EL display device of the general bottom emission structure, there are arranged a transparent anode of ITO, an organic EL layer and a thick cathode film made of Al having a high reflection factor which does not permit light to pass through but reflects light, in this order from the side of the glass substrate 110. On the side of the substrate, there are taken out light that directly passes through the transparent anode and light that is reflected by the cathode of Al and, then, passes through the anode.

In the top emission structure, on the other hand, light must be taken out through the cathode 144 of Al. It is, further, necessary to use, as a reflection electrode, the anode 140 made of ITO, Mo or Cr without having so high reflection factor. Therefore, though the aperture ratio of the pixels is improved, the organic EL display device of the top emission structure is accompanied by a problem in that it is difficult to enhance the overall efficiency for taking out light.

Here, in the TFT substrate using amorphous silicon (a-Si) as the semiconductor layer for operating TFTs, the driver IC is mounted by the TAB (tape automated bonding) system. On the contrary, in the TFT substrate using p-Si having a high mobility as the semiconductor layer for operation, it is allowed to form not only the TFTs for driving the pixels but also the TFTs for peripheral circuits such as gate drivers and data drivers in the frame regions surrounding the display region. In recent years, there have been increasingly used display devices of the type of integrated peripheral circuits integrally forming the TFTs for driving pixels and the TFTs for peripheral circuits on the same substrate.

The display device of the type of the integrated peripheral circuits requires a multi-layer wiring technology for forming complex peripheral circuits yet realizing narrow frame. In the transmission type liquid crystal display device, for example, an ITO is used as a material for forming the pixel electrodes. The ITO has a resistance higher than those of other metals, and is not suited for use as a wiring for the peripheral circuits. As the wiring, therefore, there are chiefly used two kinds of materials (two layers), i.e., a material forming the gate bus lines and gate electrodes, and a material forming drain bus lines and intermediate electrodes. However, complex circuit constitution may often require wirings of three or more layers.

Of the above two kinds of materials, further, the material forming the gate bus lines must withstand a heat treatment of a high temperature (e.g., activation of impurities injected into the semiconductor layer) at a subsequent step. In many cases, therefore, there is used a refractory metal or p-Si to which impurities are added. The refractory metal or p-Si has a relatively high resistance. Therefore, the material having a relatively low resistance is limited to a material for forming drain bus lines. Therefore, there remains a problem in that the wirings of low resistances cannot be solidly crossed via an insulating film in the peripheral circuits.

The display devices which are not of the type of integrating the peripheral circuits do not require the multi-layer wiring technology, and the above problem does not occur. Further, the display device which uses a-Si as the semiconductor layer for operating the TFTs does not have a step of heat-treatment at a high temperature, permits a low-resistance metal such as Al having a low melting point to be used as a material for forming gate bus lines and, hence, makes it possible to solidly cross the wirings having low resistances. As the panel sizes are ever increasing, however, it is urged to lower the resistance of the gate bus lines even in these display devices.

Incidentally, the document of the related art is as follows:
[Patent Document] JA-A-56-116072

SUMMARY OF THE INVENTION

It is an object of this invention to provide a display device featuring a high brightness and a good display quality.

It is another object of this invention to provide a wiring structure which makes it possible to decrease the frame and to increase the panel size, to provide a substrate for a display device equipped therewith, and a display device.

The above objects are achieved by a display device comprising:

a plurality of pixel regions arranged on a substrate;

a thin film transistor arranged for each of the pixel regions;

an organic electroluminescence element including an anode formed by using a transparent electrically conducting material for each of the pixel regions, and electrically connected to the source electrode of the thin film transistor, an organic electroluminescence layer formed on the anode, and a cathode formed on the organic electroluminescence layer to transmit light from the organic electroluminescence layer; and a reflection plate arranged being entirely covered by the anode to reflect light from the organic electroluminescence layer.

According to the invention, there is realized a display device featuring a high brightness and a good display quality.

According to the invention, there is further provided a display device which makes it possible to decrease the frame and to increase the panel size.

BRIEF DESCRIPTION OF THE DRAWINGS

FIGS. 3A and 3B are sectional views illustrating the constitution of the display device according to the second embodiment of the invention;

DESCRIPTION OF THE PREFERRED EMBODIMENTS

First Embodiment

Figure 1:
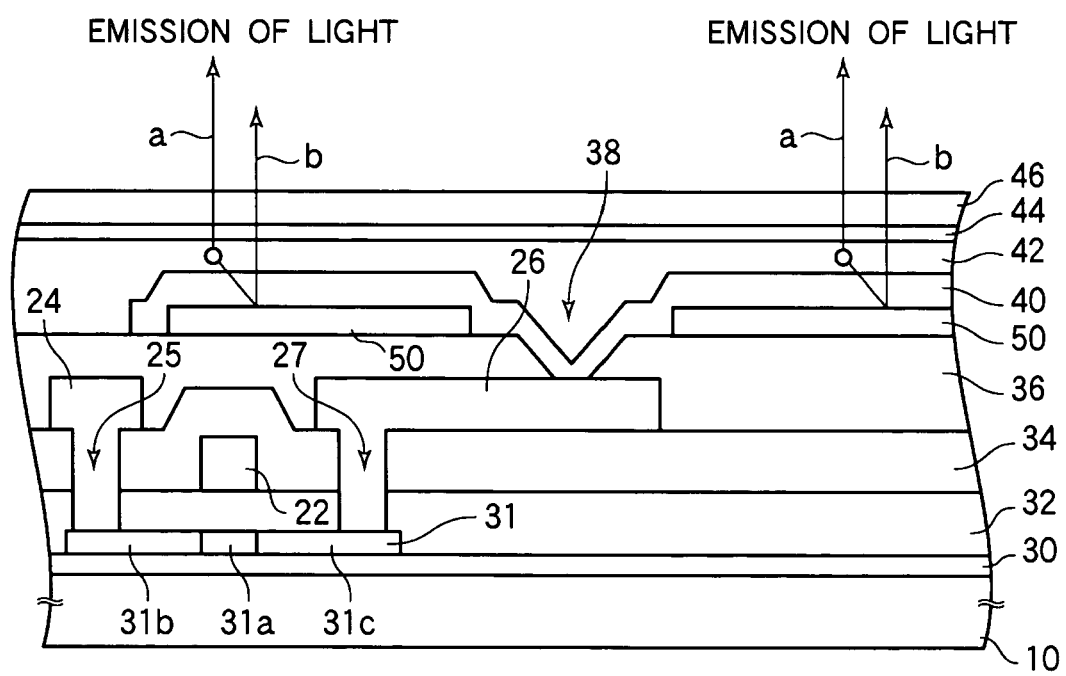
FIG. 1 is a view illustrating in cross section the constitution of an organic EL display device according to a first embodiment of the invention.

A display device according to a first embodiment of the invention will now be described with reference to FIG. 1 which is a view illustrating in cross section a pixel in the organic EL display device of a top emission structure, which is a display device of the embodiment. Referring to FIG. 1, an underlying insulating layer 30 which is a silicon oxide film ($SiO_2$) having a thickness of, for example, 200 nm is formed on the whole surface of an insulating glass substrate 10. The underlying insulating layer 30 is formed for preventing the diffusion of impurities from the glass substrate 10. A semiconductor layer 31 of a predetermined shape which is a p-Si layer having a thickness of, for example, 50 nm is formed on the underlying insulating layer 30. An insulating film 32 which is an $SiO_2$ film having a thickness of, for example, 100 nm is formed on the whole surface of the substrate on the semiconductor layer 31. A gate electrode 22 which is a molybdenum layer having a thickness of, for example, 400 nm is formed on the insulating film 32. The gate electrode 22 is connected to a gate bus line formed by using the same material as the gate electrode 22 and simultaneously therewith. Of the semiconductor layer 31, a region just under the gate electrode 22 is serving as a channel region 31a. Of the semiconductor layer 31, regions on both sides of the channel region 31a are serving as a drain region 31b and a source region 31c being doped with predetermined impurities. In the case of an n-ch TFT having an n-type of electric conduction, n-type impurities such as phosphorus ions are doped into the drain region 31b and the source region 31c. In the case of a p-ch TFT having a p-type of electric conduction, p-type impurities such as boron ions are doped therein. In order to decrease the defective display due to leakage of current, an LDD structure is frequently employed providing lightly doped drain (LDD) regions among the channel region 31a, the drain region 31b and the source region 31c.

An interlayer insulating film 34 which is a silicon nitride film (SiN film) having a thickness of, for example, 400 nm is formed on the whole surface of the substrate and on the gate electrode 22. On the interlayer insulating film 34, there are formed a drain electrode (drain bus line) 24 and a source electrode (intermediate electrode) 26 comprising a laminate of a titanium (Ti) layer having a thickness of, for example, 50 nm, an Al layer having a thickness of 150 nm and a Ti layer having a thickness of 50 nm. The drain electrode 24 is connected to the drain region 31b through a contact hole 25 formed in the interlayer insulating film 34 and in the insulating film 32. Similarly, the source electrode 26 is connected to the source region 31c through a contact hole 27 formed in the interlayer insulating film 34 and in the insulating film 32. Though FIG. 1 illustrates only one TFT, the 2 to 4 TFTs are necessary per each pixel depending upon the driving method.

An interlayer insulating film 36 which is, for example, a resin film is formed on the whole surface of the substrate on the drain electrode 24 and on the source electrode 26. The interlayer insulating film 36 is opened on the source electrode 26 to form a contact hole 38. A reflection plate 50 of an Al-type metal layer (Al or an alloy of Al as a chief component) having a thickness of, for example, 100 nm is formed on the pixel region on the interlayer insulating film 36. As the alloy containing Al as a chief component, there can be used Al—Nd and Al—Si. The reflection plate 50 is not formed in the region where the contact hole 38 is formed, and is not connected to the source electrode 26. Here, in a step of etching the Al-type metal layer for forming the reflection plate 50, the source electrode 26 is exposed through the contact hole 38. When a mixed solution of phosphoric acid, acetic acid and nitric acid is used as an etching solution for the Al-type metal layer, however, the Ti layer on the source electrode 26 is not etched and no problem arouses. If at least the surface (light-reflecting surface) is formed of an Al-type metal, then, the reflection plate 50 may be formed as a laminate of layers with other metal layer such as of Ti, Mo, Cr or the like.

An anode 40 which is an ITO layer (transparent conducting film) having a thickness of, for example, 100 nm is formed on the reflecting plate 50. The anode 40 is formed covering the whole reflecting plate 50. No interlayer insulating film is formed between the anode 40 and the reflection plate 50, which are, therefore, in direct contact with each other. In general, if the contact interface between the ITO and the Al-type metal comes in contact with a developing solution or an etching solution, aluminum is oxidized by the oxidation-reduction reaction, giving rise to the occurrence of a phenomenon (electrolytic corrosion) in which the ITO is reduced. In the constitution of this embodiment, the reflection plate 50 made of an Al-type metal is entirely covered by the anode 40 of ITO. Therefore, the contact interface does not come in contact with the developing solution or the etching solution (e.g., oxalic acid) used at the time of patterning the ITO layer, and no electrolytic corrosion occurs. The contact resistance is high between the Al-type metal and the ITO. Therefore, the anode 40 and the source electrode 26 are directly connected together through the contact hole 38. The region where the anode 40 is formed becomes a pixel region.

An organic EL layer 42 is formed on the anode 40. For example, an organic EL layer 42 that emits green light includes a positive hole injection layer made of 2-TNATA (4,4',4''-tris(2-naphthylphenylamino)triphenylamine) maintaining a thickness of 140 nm on the anode 40, a positive hole transporting layer made of α-NPD (N,N'-dinaphthyl-N, N'-diphenyl-[1,1'-biphenyl]-4,4'-diamine) maintaining a thickness of 10 nm on the positive hole injection layer, a light-emitting layer which also works as an electron transporting layer made of $Alq_3$ (tris(8-hydroxyquinorinato) aluminum) maintaining a thickness of 50 nm on the positive hole transporting layer, and an electron injection layer made of lithium fluoride maintaining a thickness of 0.5 nm on the light-emitting layer that also serves as the electron transporting layer.

A cathode 44 which is an Al layer having a thickness of, for example, 15 nm is formed on the whole surface of the substrate on the organic EL layer 42. The cathode 44 has a very small film thickness to permit the transmission of light from the organic EL layer 42. A transparent electrode 46 which is an ITO layer having a thickness of, for example, 100 nm is formed on the whole surface of the cathode 44. Unlike the anode 40 formed for each pixel region, the cathode 44 and the transparent electrode 46 are formed in the display area on the substrate to apply a common potential to all pixels. In this embodiment, the ITO is used as a material for forming the anode 40 and AL is used as a material for forming the cathode 44. An organic EL element is formed by the anode 40, organic EL layer 42 and cathode 44 for each of the pixel regions. The organic EL element is sealed by a sealing glass (not shown) arranged on the transparent electrode 46 for protection from moisture, etc. Of the light emitted from the organic EL layer 42, the light (arrow a in FIG. 1) traveling toward the cathode 44 passes directly through the cathode 44 and the transparent electrode 46 and is taken out on the side (upper side in FIG. 1) opposite to the glass substrate 10. On the other hand, the light (arrow b in FIG. 1) traveling toward the anode 40 passes through the anode 40, is reflected by the reflecting plate 50, further passes through the anode 40, organic EL layer 42, cathode 44 and transparent electrode 46, and is taken out on the side opposite to the glass substrate 10.

In this embodiment, the anode 40 is not used as the reflection plate but, instead, a reflection plate 50 of which the surface is at least made of an Al-type metal is separately provided under the anode 40 that is the transparent electrically conducting film. The Al-type metal has a high reflection factor as compared to those of Mo and Cr that are chiefly used as the anode in the conventional organic EL display devices of the top emission structure. For example, Mo has a reflection factor of about 60% while Al has a reflection factor of not smaller than 90% which is more than 1.5 times. This embodiment is provided with the reflection plate 50 of the Al-type metal having a high reflection factor, making it possible to enhance the efficiency for taking out light. Therefore, there is provided an organic EL display device having a high brightness and an excellent display quality.

The reflection plate 50 of Al-type metal is in direct contact with the anode 40 of ITO. Here, however, the anode 40 is so arranged as to entirely cover the reflection plate 50. Therefore, the contact interface between the two metals does not come into contact with the developing solution, and there occurs no electrolytic corrosion.

When the surface of the reflection plate 50 is a mirror surface, visibility may drop due to reflection of the external light. To prevent this, the interlayer insulating film 36 is formed rugged to form the reflection plate 50 intensely rugged, so that the external light is scattered and reflected by the reflecting plate 50. In the interlayer insulating film 36 of a photosensitive resin, for example, ions such as of Ar, P or B are doped into the surface followed by the heat treatment at about 150 to 250° C. to form much irregular ruggedness.

The reflection plate 50 is not used as the anode, and is not directly connected to the source electrode 26. As required, however, another contact hole may be formed separately from the contact hole 38 to directly connect the reflection plate 50 to the source electrode 26.

Second Embodiment

Figure 2:
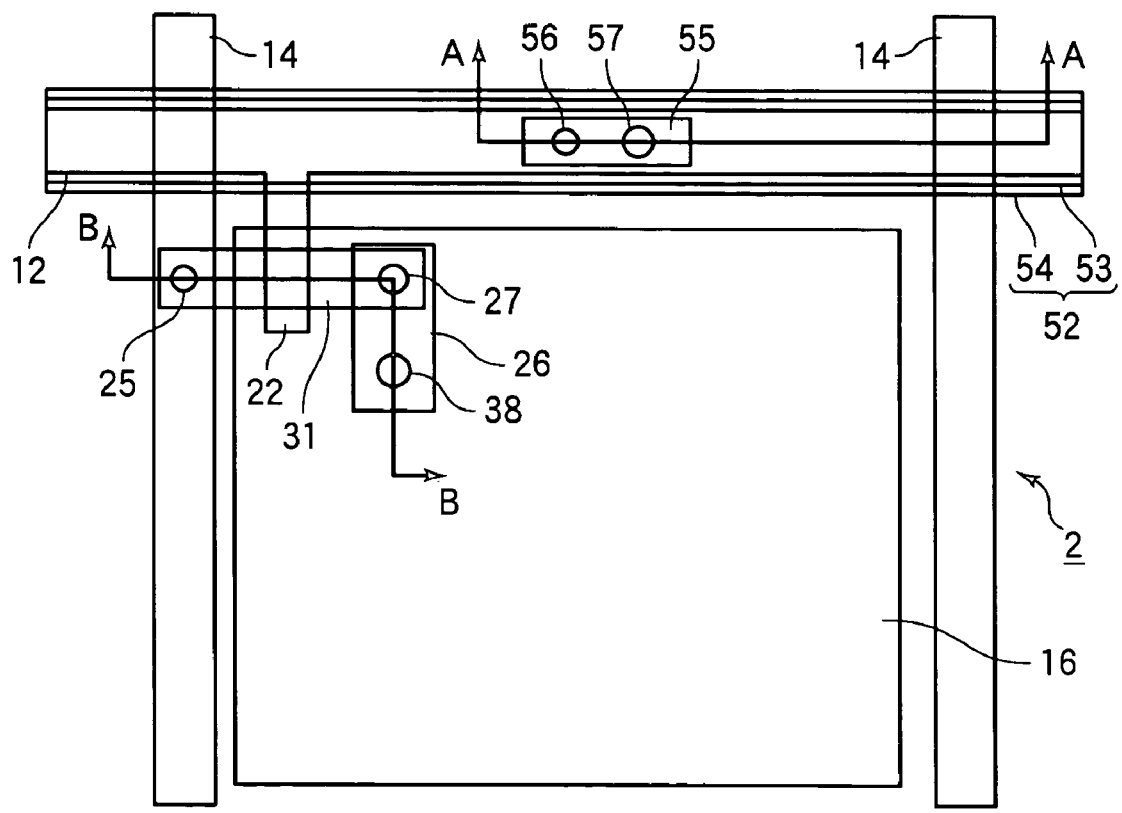
FIG. 2 is a view illustrating the constitution of a substrate for a display device according to a second embodiment of the invention.

Next, a wiring structure, a substrate for a display device provided therewith and a display device according to a second embodiment of the invention will be described with reference to FIGS. 2 and 3. FIG. 2 illustrates the constitution of a pixel in the substrate for a transmission type liquid crystal display device and a wiring structure as a substrate for a display device of the embodiment. FIG. 3A is a view illustrating in cross section the constitution of the liquid crystal display device cut along the line A-A in FIG. 2, and FIG. 3B is a view illustrating in cross section the constitution of the liquid crystal display device cut along the line B-B in FIG. 2. As illustrated in FIGS. 2, 3A and 3B, the liquid crystal display device includes a TFT substrate 2, an opposing substrate 4 forming a color filter layer 60 and a common electrode 62 on a glass substrate 11, and liquid crystals 6 sealed between the two substrates 2 and 4.

The TFT substrate 2 has a plurality of gate bus lines (first wiring) 12 extending in the right-and-left direction in FIG. 2. The gate bus lines 12 are formed of a refractory metal such as Mo so as to withstand the heat treatment conducted in a subsequent step. There are further formed a plurality of drain bus lines 14 extending in the up-and-down direction in FIG. 2 crossing the gate bus lines 12 via the interlayer insulating film 34. The drain bus lines 14 are formed of a laminate of layers of, for example, Ti, Al and Ti. A TFT similar to that of the first embodiment is formed near a position where the gate bus line 12 and the drain bus line 14 cross each other. The gate electrode 22 of TFT is electrically connected to the gate bus line 12, and part of the drain bus line 14 is working as a drain electrode 24 of the TFT. A pixel electrode (transparent electrode) 16 of ITO is formed in each pixel region. The pixel electrode 16 is connected to the source electrode 26 of the TFT through a contact hole 38 formed in the interlayer insulating film 36.

In this embodiment, a second wiring 52 is formed extending in the right-and-left direction in FIG. 2 being nearly overlapped on the gate bus line 12 via interlayer insulating films 34 and 36. The wiring 52 includes an Al-type metal layer (first layer) 53 having a relatively low resistance, and an ITO layer (second layer) 54 formed on the Al-type metal layer 53 using the same material as that of the pixel electrode 16. The ITO layer 54 is patterned in a size larger than the Al-type metal layer 53 so as to cover the whole Al-type metal layer 53.

The Al-type metal layer 53 of the wiring 52 is directly connected to an intermediate electrode 55 via a contact hole 57 formed in the interlayer insulating film 36. The intermediate electrode 55 is made of the same material as that of the drain bus line 14 being nearly overlapped on the gate bus line 12 in each of the pixels. The intermediate electrode 55 is connected to the gate bus line 12 through a contact hole 56 formed in the interlayer insulating film 34. Namely, the Al-type metal layer 53 of the wiring 52 is electrically connected to the gate bus line 12 without passing through the ITO layer 54 having a relatively high resistance. Instead of forming the intermediate electrode 55, the Al-type metal layer 53 and the gate bus line 12 may be connected together through a contact hole formed in the interlayer insulating films 36 and 34.

The pixel electrode 16 is directly connected to the source electrode 26 of the TFT through a contact hole 38 formed in the interlayer insulating film 36. The pixel electrode 16 of ITO and the source electrode 26 of which the surface is formed of Ti are connected together without passing through the Al-type metal layer to suppress the contact resistance between the pixel electrode 16 and the source electrode 26.

Though not illustrated in FIGS. 2 and 3, a storage capacitor is usually formed in parallel with a liquid crystal capacity in each pixel. The storage capacitor bus line which is one electrode of the storage capacitor is formed using the same material as that of the gate bus line 12. The storage capacitor electrode which is another electrode is formed by using the same material as that of the drain bus line 14, and is electrically connected to the pixel electrode 16. In the frame region of the TFT substrate 2, there are formed peripheral circuits using TFTs which are formed simultaneously with the TFTs for driving the pixels.

In this embodiment, the gate bus line 12 and the wiring 52 (Al-type metal layer 53 and ITO layer 54) are electrically connected together in parallel to constitute a substantially two-layered gate bus line (12, 52). Therefore, though Mo which is a material forming the gate bus line 12 has a resistance (resistivity) about 3 to 10 times as large as that of the Al-type metal, the resistance of the gate bus line (12, 52) becomes equal to, or smaller than, that of the Al-type metal electrode 53. This embodiment is very effective in the constitution in which the gate bus line 12 is lengthened due to an increase in the panel size. Similarly, further, storage capacitor bus line can be formed in two layers to lower the resistance of the storage capacitor bus line. In this embodiment, further, in patterning the ITO layer 54, the contact interface between the ITO layer 54 and the Al-type metal layer 53 is not brought into contact with the developing solution or the etching solution, preventing the occurrence of electrolytic corrosion. Though this embodiment has dealt with the liquid crystal display device of the transmission type, the reflection electrode may be formed in each of the pixels by using the Al-type metal layer 53 provided the liquid crystal display device is of the semi-transmission type or of the reflection type. By forming the pixel electrode 16 so as to cover the reflection electrode, the occurrence of electrolytic corrosion is prevented like the one described above.

Third Embodiment

Figure 4:
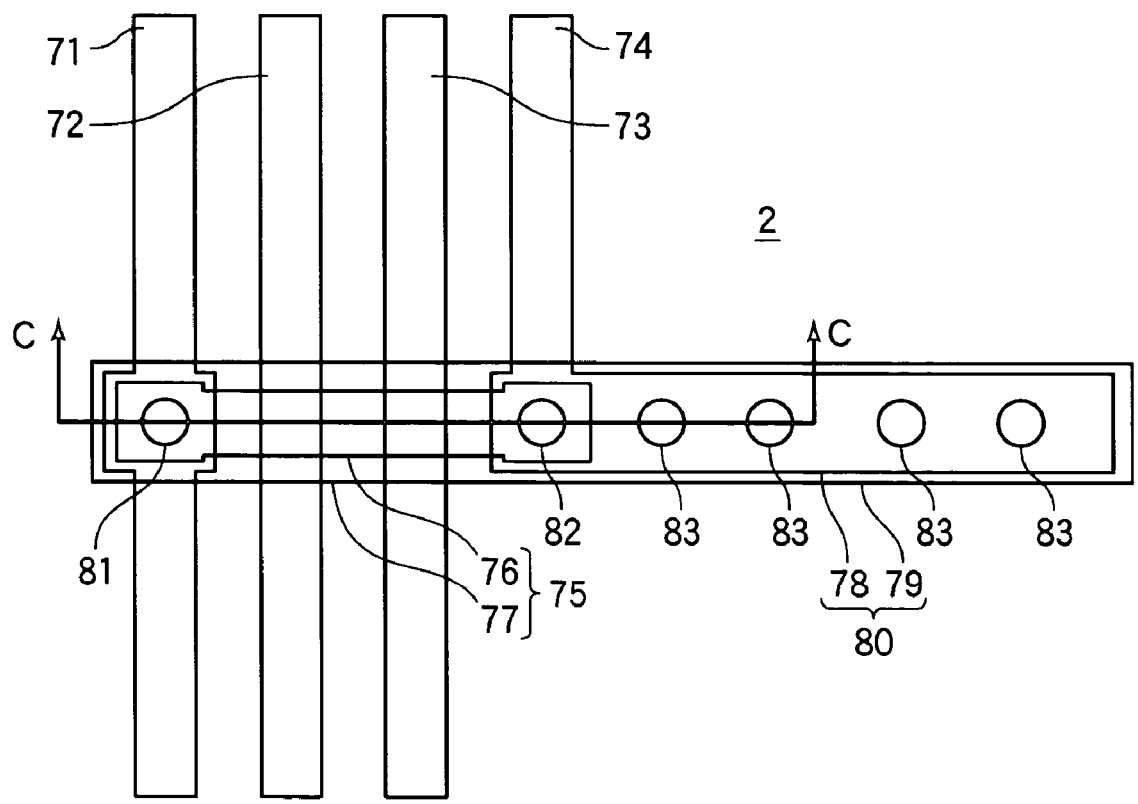
FIG. 4 is a view illustrating a wiring structure according to a third embodiment of the invention.
Figure 5:
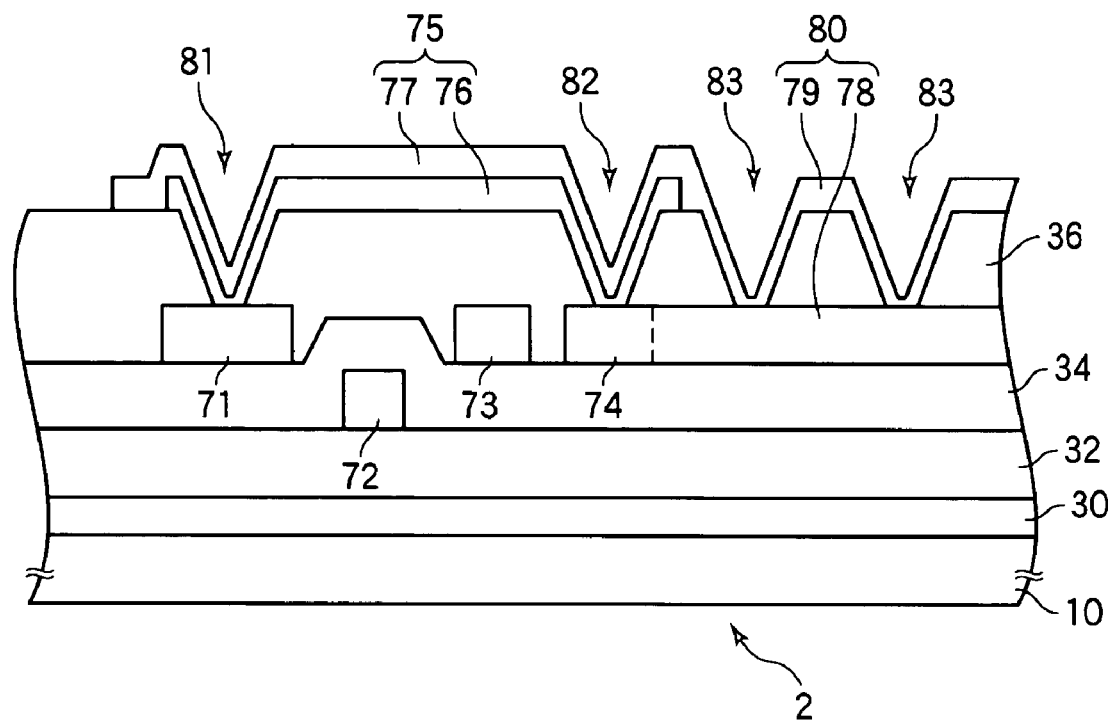
FIG. 5 is a sectional view illustrating the wiring structure according to the third embodiment of the invention.
Figure 6:
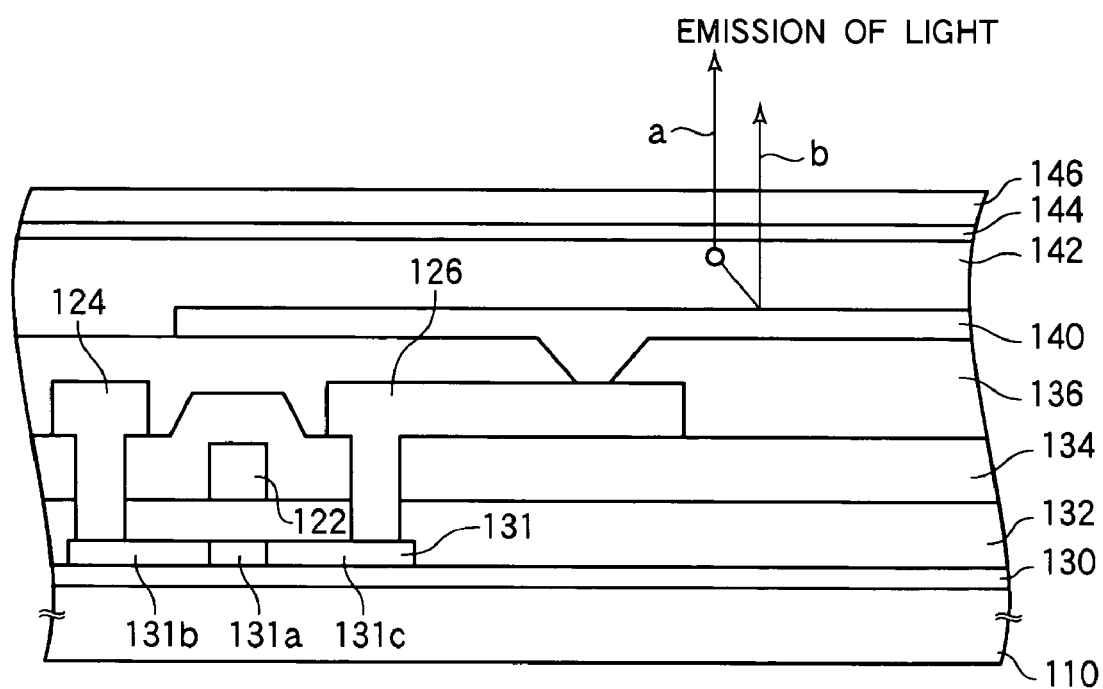
FIG. 6 is a view illustrating in cross section the constitution of a pixel in the organic EL display device of a general top emission structure.

Next, a wiring structure and a substrate for a display device provided therewith according to a third embodiment of the invention will be described with reference to FIGS. 4 and 5. FIG. 4 illustrates the wiring structure near a terminal unit in the peripheral circuit of the substrate for a display device according to the embodiment. FIG. 5 is a view illustrating in cross section the constitution of the substrate for a display device cut along the line C-C in FIG. 4. Referring to FIGS. 4 and 5, on the TFT substrate 2, there are arranged four wirings 71, 72, 73 and 74 extending up and down in FIG. 4 and being arranged in parallel from the left. The wirings 71, 73 and 74 are formed by using the material (e.g., laminate of Ti, Al and Ti layers) same as the one forming the drain bus line 14 (not illustrated in FIGS. 4 and 5) in the display region. The wiring 72 is formed by using the same material (e.g., Mo) as the one forming the gate bus line 12 (not illustrated in FIGS. 4 and 5).

On the interlayer insulating film 36, a wiring 75 is formed extending in the right-and-left direction in FIG. 4. The wiring 75 includes an Al-type metal layer 76 of a relatively low resistance and an ITO layer 77 formed on the Al-type metal layer 76 using the same material (ITO) as that of the pixel electrode 16 (not illustrated in FIGS. 4 and 5) in the display region. In the liquid crystal display device of, for example, the transreflective type or the reflective type, the reflection electrode is formed by using the same material as the Al-type metal layer 76. The ITO layer 77 is patterned in a size larger than the Al-type metal layer 76 so as to cover the whole Al-type metal layer 76. The Al-type metal layer 76 of the wiring 75 is directly connected to the wiring 71 through a contact hole 81 and is directly connected to the wiring 74 through a contact hole 82. Here, the ITO layer 77 of the wiring 75 may be connected to the wirings 71 and 74 through other contact holes. Even in this case, too, a current must be flown to the Al-type metal layer 76 of a low resistance when the wiring 75 becomes long. Therefore, the Al-type metal layer 76 is directly connected to the wirings 71 and 74. The wiring 75 is solidly crossing the wirings 72 and 73 via the interlayer insulating films 36 (and 34). Therefore, the wiring 71 and the wiring 74 are electrically connected together without being connected to the wirings 72 and 73.

The wiring 74 is connected to a terminal unit 80 used for connection to an external unit. The terminal unit 80 includes a lower electrode (lower layer) 78 integrally formed together with the wiring 74 using the same material as that of the drain bus line 14 and an upper electrode (upper layer) 79 integrally formed together with the ITO layer 77 of the wiring 75 using the same material as that of the pixel electrode 16. The upper electrode 79 comes in contact with the external air and is formed by using the ITO that is corroded little instead of using a metal such as Al. The terminal unit 80 does not have the Al-type metal layer. Therefore, the upper electrode 79 is directly connected to the lower electrode 78 through a plurality of contact holes 83. The upper layer of the lower electrode 78 is formed of Ti and, hence, the contact resistance becomes relatively low between the upper electrode 79 and the lower electrode 78. Therefore, though the contact resistance is high between Al and ITO, there is no problem in transmitting signals between the wirings 71, 74 and the upper electrode 79.

In this embodiment, the wiring 75 is formed as a layer different from the wiring 72 formed by using the same material as the gate bus line 12 or different from the wirings 71, 73, 74 formed by using the same material as the drain bus line 14. The wiring 75 has an Al-type metal layer 76 of a low resistance, making it possible to solidly cross the wirings having low resistances and to realize a technology of multi-layer wiring. It is therefore allowed to form a complex peripheral circuit realizing a narrowed frame of the display device.

In patterning the ITO layer 77 in this embodiment, the contact interface between the ITO layer 77 and the Al-type metal layer 76 does not come in contact with the developing solution or the etching solution, preventing the occurrence of electrolytic corrosion.

The present invention can be modified in a variety of ways not being limited to the above embodiments only.

The above embodiments have dealt with the display device provided with TFTs of the top gate type using p-Si as the active semiconductor layer. Not being limited thereto only, however, the invention can also be applied to the display device equipped with TFTs of an inverse stagger type using a-Si as the active semiconductor layer.

Further, the above second and third embodiments have dealt with the liquid crystal display devices. Not being limited thereto only, however, the invention can be applied to the organic EL display devices and other display devices as well.

What is claimed is:
1. A display device comprising:
a plurality of pixel regions arranged on a substrate;
a thin film transistor arranged for each of the pixel regions;
an organic electroluminescence element including an anode formed by using a transparent electrically conducting material for each of the pixel regions, and electrically connected to the source electrode of the thin film transistor, an organic electroluminescence layer formed on the anode, and a cathode formed on the organic electroluminescence layer to transmit light from the organic electroluminescence layer; and
a reflection plate arranged in direct contact with the anode, as well as being entirely covered by the anode on an upper surface and both side edges thereof, such that the organic electroluminescence layer does not contact the reflection plate, and wherein the reflection plate is configured to reflect light from the organic electroluminescence layer.

2. A display device according to claim 1, wherein the anode is electrically connected to the source electrode without the reflection plate.

3. A display device according to claim 2, wherein the anode is directly connected to the source electrode.

4. A display device according to claim 1, wherein the anode is patterned in a size larger than that of the reflection plate.

5. A display device according to claim 1, wherein the anode is formed by using ITO.

6. A display device according to claim 1, wherein the reflection plate has a light-reflecting surface formed by using Al or an alloy containing Al as a chief component.

* * * * *